(12) United States Patent
Hwang et al.

(10) Patent No.: US 10,810,937 B2
(45) Date of Patent: Oct. 20, 2020

(54) DISPLAY APPARATUS AND METHOD OF COMPENSATING FOR DATA THEREOF

(71) Applicant: Samsung Display Co., Ltd., Yongin-si, Gyeonggi-do (KR)

(72) Inventors: Jong-kwang Hwang, Asan-si (KR); Si-beak Pyo, Asan-si (KR); Jae-won Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 88 days.

(21) Appl. No.: 16/101,680

(22) Filed: Aug. 13, 2018

(65) Prior Publication Data

US 2019/0080648 A1 Mar. 14, 2019

(30) Foreign Application Priority Data

Sep. 11, 2017 (KR) .................. 10-2017-0116167

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *G09G 3/3291* (2013.01);
(Continued)

(58) Field of Classification Search
CPC ... G09G 2300/0814; G09G 2300/0819; G09G 2310/0264; G09G 2320/0223;
(Continued)

(56) References Cited

U.S. PATENT DOCUMENTS

| 7,447,379 B2 | 11/2008 | Choe et al. |
| 2014/0347596 A1* | 11/2014 | Ikuta ............... G02B 6/0091 349/58 |

(Continued)

FOREIGN PATENT DOCUMENTS

| KR | 10-0590529 B1 | 6/2006 |
| KR | 10-2007-0074792 A | 7/2007 |

(Continued)

*Primary Examiner* — Amy Onyekaba
(74) *Attorney, Agent, or Firm* — Lewis Roca Rothgerber Christie LLP

(57) ABSTRACT

A display apparatus includes: a display panel including: a normal part and a notch part; a display area at the normal part and the notch part, the display area comprising a first display area within the normal part, a second display area overlapping the normal part and the notch part, and a third display area within the notch part, each of the normal part and the notch part comprising a plurality of pixels; and a compensation circuit configured to: receive first, second, and third input signals having image information respectively displayed through the first, second, and third display areas; and compensate for a grayscale value of the first, second, and third input signals, wherein the compensation circuit is configured to compensate for the first and third input signals based on pixel characteristic data and compensate for the second input signal based on seed data different from the pixel characteristic data.

20 Claims, 10 Drawing Sheets

(51) Int. Cl.
 *G09G 3/3291* (2016.01)
 *H01L 27/32* (2006.01)
(52) U.S. Cl.
 CPC . *H01L 27/3244* (2013.01); *G09G 2300/0814* (2013.01); *G09G 2300/0819* (2013.01); *G09G 2310/0264* (2013.01); *G09G 2320/0223* (2013.01); *G09G 2320/0233* (2013.01)
(58) Field of Classification Search
 CPC ......... G09G 2320/0233; G09G 3/3233; G09G 3/3266; G09G 3/3291; H01L 27/3244
 See application file for complete search history.

(56) References Cited

U.S. PATENT DOCUMENTS

| | | | |
|---|---|---|---|
| 2015/0279325 A1 | 10/2015 | Lu et al. | |
| 2016/0133195 A1* | 5/2016 | Park | G09G 3/3275 345/694 |
| 2017/0206842 A1* | 7/2017 | An | G09G 3/3291 |
| 2017/0249896 A1* | 8/2017 | Kim | H01L 27/124 |
| 2017/0251137 A1* | 8/2017 | Evans, V | G02F 1/13318 |
| 2018/0129106 A1* | 5/2018 | Gao | G09G 3/3611 |
| 2018/0158417 A1* | 6/2018 | Xiang | G09G 3/3233 |
| 2018/0190190 A1* | 7/2018 | Xi | G09G 3/3208 |

FOREIGN PATENT DOCUMENTS

| | | |
|---|---|---|
| KR | 10-2015-0112860 A | 10/2015 |
| KR | 10-1720342 B1 | 3/2017 |

\* cited by examiner

DISPLAY APPARATUS AND METHOD OF COMPENSATING FOR DATA THEREOF

CROSS-REFERENCE TO RELATED APPLICATION

This application claims priority to and the benefit of Korean Patent Application No. 10-2017-0116167, filed on Sep. 11, 2017, the content of which is hereby incorporated by reference in its entirety.

BACKGROUND

1. Field

Aspects of some example embodiments of the present invention relate to a display apparatus and a method of compensating for data thereof.

2. Description of the Related Art

In recent years, there has been a notable increase in use of electronic devices employing a display panel for displaying an image. The display panel is utilized not only with the electronic devices in which the function of displaying an image is essential, such as a smartphone, a notebook, a television set, etc., but also with electronic devices that may not traditionally utilize display panels, such as refrigerators, washing machines, printers, etc. Display panels may have various shapes depending on the shape of the electronic devices or the needs of the manufacturer of the electronic devices. In contrast to display panels that have a general rectangular shape, display panels having an irregular shape may have a brightness level that varies for various areas of the display panel.

The above information disclosed in this Background section is only for enhancement of understanding of the background and therefore it may contain information that does not constitute prior art.

SUMMARY

Aspects of some example embodiments of the present invention relate to a display apparatus and a method of compensating for data thereof. For example, some example embodiments of the present invention relate to a display apparatus having an irregular structure and a method of compensating for data of the display apparatus.

Some example embodiments of the present invention may include a display apparatus capable of uniformly (or relatively uniformly) controlling a brightness of an image displayed through a display panel having an irregular shape.

Some example embodiments of the present invention may include a method of compensating for data of the display apparatus.

According to some example embodiments of the present invention, a display apparatus includes: a display panel including: a normal part and a notch part protruding from the normal part; a display area at the normal part and the notch part, the display area comprising a first display area within the normal part, a second display area overlapping the normal part and the notch part, and a third display area within the notch part, each of the normal part and the notch part comprising a plurality of pixels; and a non-display area adjacent to the display area; and a compensation circuit configured to: receive first, second, and third input signals having image information respectively displayed through the first, second, and third display areas; and compensate for a grayscale value of the first, second, and third input signals, wherein the compensation circuit is configured to compensate for the first and third input signals based on pixel characteristic data and to compensate for the second input signal based on seed data different from the pixel characteristic data.

According to some embodiments, the normal part has a quadrangular shape, and the notch part comprises a first notch part protruding from a first corner of one side portion of the normal part and a second notch part protruding from a second corner of the one side portion of the normal part and spaced apart from the first notch part.

According to some embodiments, the first, second, and third display areas are adjacent to each other in a first direction and distinguished from each other with respect to an imaginary line extending in a second direction parallel to the one side portion of the normal part.

According to some embodiments, the display panel includes first, second, and third scan lines connected to corresponding pixels among the pixels and first and second scan driving circuits in the non-display area and spaced apart from each other, wherein the first scan line is in the normal part, the second scan line is in the first notch part, and the third scan line is in the third notch part.

According to some embodiments, a first end of the first scan line is connected to the first scan driving circuit, a second end of the first scan line is connected to the second scan driving circuit, the second scan line is connected to the first driving circuit, and the third scan line is connected to the second driving circuit.

According to some embodiments, the compensation circuit includes: a memory configured to store the pixel characteristic data having brightness information of the first, second, and third display areas in a pixel group comprising some pixels of the pixels; a calculator configured to calculate the seed data having the brightness information of the second display area in the pixel group unit based on the pixel characteristic data; and a compensator configured to compensate for the first and third input signals based on the pixel characteristic data and to compensate for the second input signal based on the seed data.

According to some embodiments, the calculator is configured to interpolate the brightness information of the pixel group of the first display area and the brightness information of the pixel group of the third display area to calculate the seed data.

According to some embodiments, the first, second, and third display areas are adjacent to each other in a first direction and distinguished from each other with respect to an imaginary line extending in a second direction crossing the first direction, and the seed data have an offset compensation value that linearly varies depending on a position of the second display area in the first direction.

According to some embodiments, the compensation circuit includes: a memory configured to store the pixel characteristic data having brightness information of the first, second, and third display areas in a pixel group comprising some pixels of the pixels and area characteristic data having the brightness information of each of the pixels overlapped with the second display area; a calculator configured to calculate the seed data having the brightness information of the second display area in the pixel group unit based on the pixel characteristic data and the area characteristic data; and a compensator configured to compensate for the first and third input signals based on the pixel characteristic data and to compensate for the second input signal based on the seed data.

According to some embodiments, the first, second, and third display areas are adjacent to each other in a first direction and distinguished from each other with respect to an imaginary line extending in a second direction crossing the first direction, and the seed data have an offset compensation value having a curved shape depending on a position of the second display area in the first direction.

According to some embodiments, the calculator is configured to calculate the curved shape of the offset compensation value depending on the position of the second display area in the first direction based on the area characteristic data, and the calculator is configured to determine a range of the offset compensation value of the seed data using the brightness information of the pixel group in the first display area and the brightness information of the pixel group in the third display area.

According to some example embodiments, a display apparatus includes: a display panel including: a normal part and a notch part protruded from the normal part; a display area at the normal part and the notch part, the display area comprising a first display area within the normal part, a second display area overlapping the normal part and the notch part, and a third display area within the notch part, each of the normal part and the notch part comprising a plurality of pixels; and a non-display area adjacent to the display area; and a compensation circuit configured to: receive first, second, and third input signals having image information respectively displayed through the first, second, and third display areas; and compensate for a grayscale value of the first, second, and third input signals, the compensation circuit comprising a memory configured to store pixel characteristic data, wherein the compensation circuit is configured to compensate the first and third input signals for an offset compensation value of the pixel characteristic data and to compensate the second input signal for a value different from the offset compensation value of the pixel characteristic data.

According to some embodiments, the normal part has a quadrangular shape, and the notch part comprises a first notch part protruding from a first corner of one side portion of the normal part and a second notch part protruding from a second corner of the one side portion of the normal part and spaced apart from the first notch part.

According to some embodiments, the first, second, and third display areas are adjacent to each other in a first direction and distinguished from each other with respect to an imaginary line extending in a second direction parallel to the one side portion of the normal part.

According to some embodiments, the compensation circuit includes: a memory configured to store the pixel characteristic data having brightness information of the first, second, and third display areas in a pixel group unit comprising some pixels of the pixels; a calculator configured to calculate seed data having the brightness information of the second display area in the pixel group unit based on the pixel characteristic data; and a compensator configured to compensate for the first and third input signals based on the pixel characteristic data and to compensate for the second input signal based on the seed data.

According to some example embodiments, in a method of compensating for data of a display apparatus, the display apparatus including: a display panel including: a normal part and a notch part protruding from the normal part; a display area at the normal part and the notch part, the display area comprising a first display area in the normal part, a second display area overlapping the normal part and the notch part, and a third display area in the notch part, each of the normal part and the notch part comprising a plurality of pixels; and a non-display area adjacent to the display area, the method includes: compensating for first and third input signals having image information respectively displayed through the first and third display areas based on pixel characteristic data; and compensating for the second input signal having the image information displayed through the second display area based on seed data different from the pixel characteristic data.

According to some embodiments, the method further includes calculating the seed data based on the pixel characteristic data stored in a memory.

According to some embodiments, the calculating of the seed data comprises interpolating brightness information of a pixel group comprising some pixels of the pixels of the first display area and brightness information of a pixel group of the third display area to calculate the seed data.

According to some embodiments, the method further includes calculating the seed data based on the pixel characteristic data and area characteristic data which are stored in a memory.

According to some embodiments, the calculating of the seed data includes calculating a curved shape of an offset compensation value depending on a position of the second display area based on the area characteristic data.

According to the display apparatus and the method of compensating for the data of the display apparatus according to some example embodiments, although the display panel has the irregular shape, the brightness of the image displayed through the display panel may be controlled to be uniform.

BRIEF DESCRIPTION OF THE DRAWINGS

The above and other aspects of some example embodiments of the present invention will become more apparent by reference to the following detailed description when considered in conjunction with the accompanying drawings wherein.

DETAILED DESCRIPTION

Figure 1:
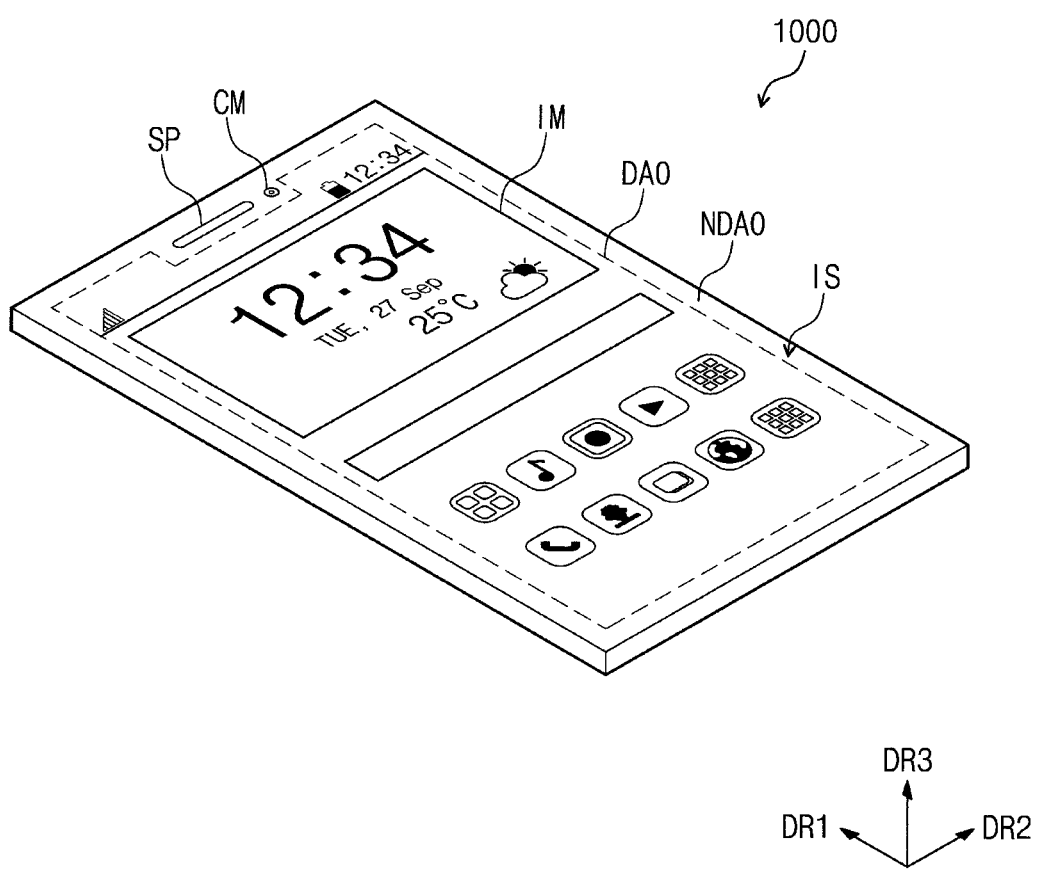
FIG. 1 is a perspective view showing a display apparatus according to some example embodiments of the present invention.

Hereinafter, aspects of some example embodiments of the present invention will be explained in more detail with reference to the accompanying drawings. In the following descriptions, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, rate, and size of elements are exaggerated for clarity. As used herein, the term "and/or" includes any and all combinations of one or more of the associated listed items.

The use of the terms first, second, etc. do not denote any order or importance, but rather the terms first, second, etc. are used to distinguish one element from another. Thus, a first element, component, region, layer or section discussed below could be termed a second element, component, region, layer or section without departing from the teachings of the present disclosure. It is to be understood that the singular forms "a," "an," and "the" include plural referents unless the context clearly dictates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

FIG. 1 is a perspective view showing a display apparatus 1000 according to some example embodiments of the present invention.

In some example embodiments of the present invention, the display apparatus 1000 may be various electronic devices, such as a smartphone, a tablet personal computer, a personal multimedia player (PMP), a notebook computer, etc. FIG. 1 shows the smartphone as the display apparatus 1000 as a representative example.

Referring to FIG. 1, the display apparatus 1000 includes a display surface IS on which a display area DA0 displaying an image and a non-display area NDA0 arranged adjacent to the display area DA0 are defined. The display area DA0 is an area through which the image is displayed. The non-display area NDA0 is an area through which no image is displayed. The display surface IS of the display apparatus 1000 may be an outermost surface of the display apparatus 1000 and may be a surface at which a user is looking.

The display apparatus 1000 may include a speaker SP and a camera module CM. The speaker SP and the camera module CM are arranged to overlap with the non-display area NDA0 and not to overlap with the display area DA0.

The display area DA0 may have a shape in which at least one side portion of a rectangular shape is protruded. The shape of the display area DA0 will be described in detail later. The non-display area NDA0 has a shape surrounding the display area DA0. However, the shapes of the display area DA0 and the non-display area NDA0 should not be limited thereto or thereby, and the display area DA0 and the non-display area NDA0 may have various shapes.

As shown in FIG. 1, the display surface IS through which the image IM is displayed is substantially parallel to a surface defined by a first direction DR1 and a second direction DR2. A third direction DR3 indicates a normal line direction of the display surface IS, i.e., a thickness direction of the display apparatus 1000. A front surface (or an upper surface) and a rear surface (or a lower surface) of each member of the display apparatus 1000 are distinguished from each other by the third direction DR3. However, directions indicated by the first, second, and third directions DR1, DR2, and DR3 are relative to each other, and thus the first, second, and third directions DR1, DR2, and DR3 may be changed to other directions.

Figure 2:
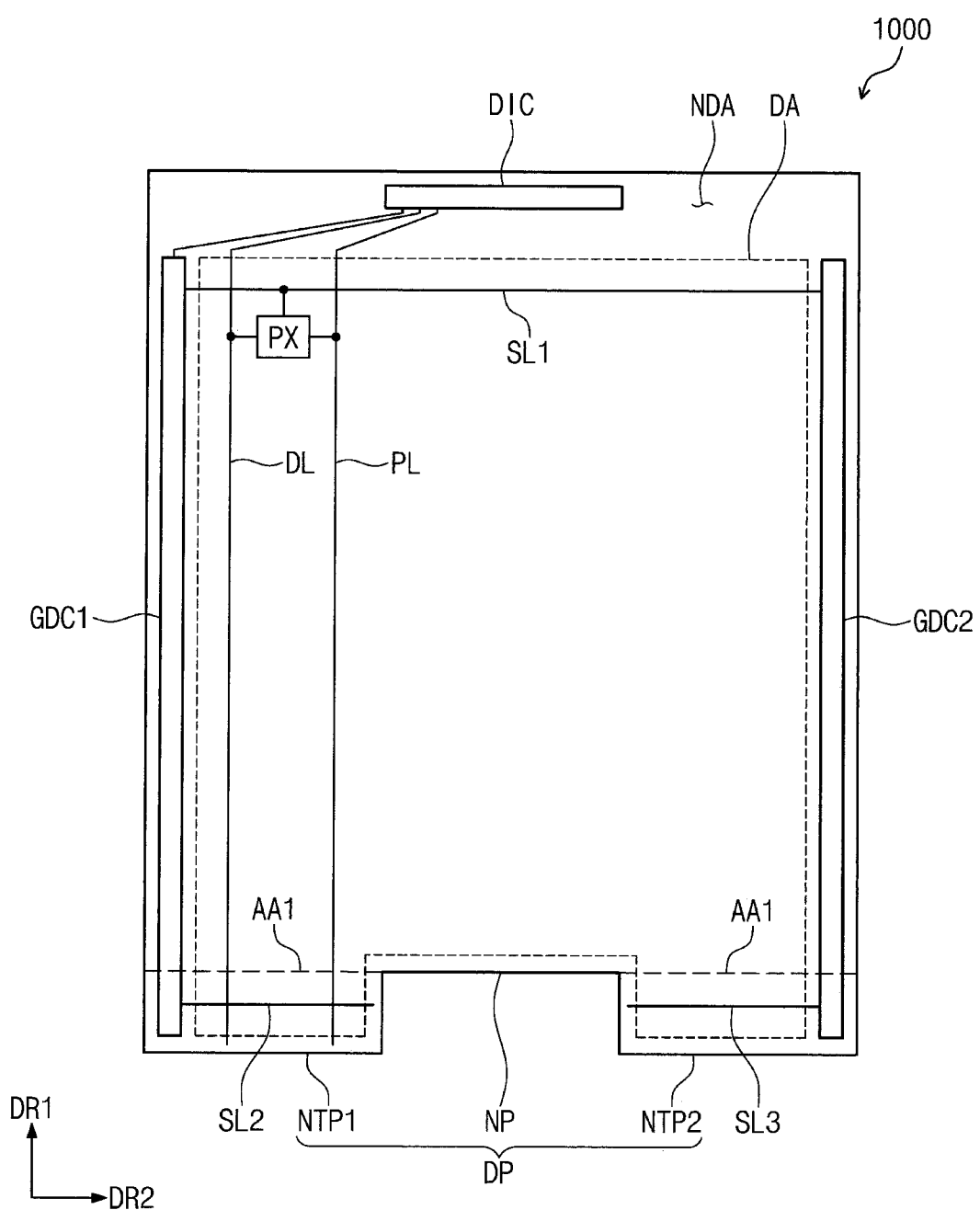
FIG. 2 is a plan view showing a part of the display apparatus of FIG. 1.

FIG. 2 is a plan view showing a part of the display apparatus 1000 of FIG. 1.

Referring to FIG. 2, the display apparatus 1000 includes a display panel DP and a driving circuit chip DIC.

The display panel DP may be a light emitting type display panel, but it should not be particularly limited. For instance, the display panel DP may be an organic light emitting display panel or a quantum dot light emitting display panel. A light emitting layer of the organic light emitting display panel includes an organic light emitting material. A light emitting layer of the quantum dot light emitting display panel includes a quantum dot and a quantum rod. Hereinafter, the organic light emitting display panel will be described as the display panel DP.

The display panel DP may include a display area DA and a non-display area NDA adjacent to the display area DA when viewed in a plan view. The display panel DP displays the image through the display area DA and does not display the image through the non-display area NDA. The display area DA and the non-display area NDA shown in FIG. 2 respectively correspond to the display area DA0 and the non-display area NDA0 shown in FIG. 1. However, the display area DA and the non-display area NDA of the display panel DP does not need to be the same as the display area DA0 and the non-display area NDA0 of the display apparatus 1000, and the display area DA and the non-display area NDA may be changed depending on structure and design of the display panel DP.

The display panel DP may include a pixel PX, a plurality of signal lines, and scan driving circuits GDC1 and GDC2.

The pixel PX is arranged in the display area DA and displays the image. The pixel PX may be provided in a plural number, and the pixels PX may be arranged in a matrix configuration or a non-matrix configuration such as a pentile configuration.

The signal lines may include scan lines SL1 to SL3, a data line, and a power line PL. Each of the data line DL and the power line PL is provided in a plural number, however, for the convenience of explanation, one data line DL and one power line PL are shown in FIG. 2. The scan lines SL1 to SL3 are provided in three or more numbers, but for the convenience of explanation, three scan lines SL1 to SL3 are shown in FIG. 2.

The display panel DP may include a normal part (or normal area) NP and notch parts (or notch areas) NTP1 and NTP2. The normal part NP and the notch parts NTP1 and NTP2 are integrally formed with each other, and the normal part NP and the notch parts NTP1 and NTP are divided to explain the shape of the display panel DP.

The normal part NP may have a quadrangular shape. The notch parts NTP1 and NTP2 may protrude from one side portion of the normal part NP. The number of the notch parts NTP1 and NTP2 should not be particularly limited, but in the present embodiment of the present disclosure, the notch parts NTP1 and NTP2 include first and second notch parts NTP1 and NTP2. The camera module CM and the speaker SP described with reference to FIG. 1 may be arranged between the first and second notch parts NTP1 and NTP2.

The first notch part NTP1 is protruded from a first corner of one side portion AA1 of the normal part NP to an opposite direction of the first direction DR1. The second notch part NTP2 is protruded from a second corner of the one side portion AA1 of the normal part NP to the opposite direction of the first direction DR1. The first and second notch parts NTP1 and NTP2 are spaced apart from each other in the second direction DR2.

In FIG. 2, the scan lines SL1, SL2, and SL3 include first, second, and third scan lines SL1, SL2, and SL3. The first scan line SL1 is arranged in the normal part NP, the second scan line SL2 is arranged in the first notch part NTP1, and the third scan line SL3 is arranged in the second notch part NTP2. The first scan line SL1 may have a length longer than that of the second and third scan lines SL2 and SL3.

The first to third scan lines SL1 to SL3, the data line DL, and the power line PL are connected to the pixel PX. The data line DL and the power line PL are connected to the driving circuit chip DIC to receive a driving signal.

The scan driving circuits GDC1 and GDC2 may include a first scan driving circuit GDC1 and a second scan driving circuit GDC2. The first scan driving circuit GDC1 and the second scan driving circuit GDC2 may be arranged in the non-display area NDA. The first scan driving circuit GDC1 may be arranged in the normal part NP and the first notch part NTP1. The second scan driving circuit GDC2 may be arranged in the normal part NP and the second notch part NTP2.

The first and second scan driving circuits GDC1 and GDC2 generate scan lines and apply the generated scan lines to the first to third scan lines SL1 to SL3.

The first and second scan driving circuits GDC1 and GDC2 are connected to both ends of the first scan line SL1, respectively. The first and second scan driving circuits GDC1 and GDC2 apply the scan line to both ends of the first scan line SL1 to prevent (or reduce) the occurrence of a charge defect caused by a delay of the scan signal applied to the first scan line SL1.

The first scan driving circuit GDC1 is connected to one end of the second scan line SL2, and the second scan driving circuit GDC2 is connected to one end of the third scan line SL3. The second and third scan lines SL2 and SL3 are respectively arranged in the first and second notch parts NTP1 and NTP2, and each of the second and third scan lines SL2 and SL3 receives the scan signal from a corresponding scan driving circuit of the first and second scan driving circuits GDC1 and GDC2. Because the second and third scan lines SL2 and SL3 have the length shorter than the length of the first scan line SL1, the charge defect caused by the delay of the scan signal in the first scan line SL1 does not occur in the second and third scan lines SL2 and SL3.

The first and second scan driving circuits GDC1 and GDC2 may include a plurality of thin film transistors formed through the same process as that applied to a driving circuit of the pixels PX, e.g., a low temperature polycrystalline silicon (LTPS) process, a low temperature polycrystalline oxide (LTPO) process, etc.

The driving circuit chip DIC may be arranged in the non-display area NDA. The driving circuit chip DIC may be directly mounted in the non-display area NDA, but it should not be limited thereto or thereby. That is, the driving circuit chip DIC may be mounted on a flexible printed circuit board connected through a pad arranged in the non-display area NDA. The driving circuit chip DIC provides signals needed to drive the display panel DP. That is, the driving circuit chip DIC may provide the signals to the data line DL and the power line PL. The driving circuit chip DIC may be, but not limited to, a source driver integrated circuit that applies a data signal to the data line DL.

In the embodiment of the present disclosure, the driving circuit chip DIC may include a compensation circuit. The compensation circuit may receive an input signal having image information to be displayed in the display area DA and compensate for the input signal to output compensation data. Details on the compensation circuit will be described later.

In some example embodiments of the present invention, the compensation circuit may be included in the driving circuit chip DIC, but it should not be limited thereto or thereby. The compensation circuit may be provided on a separate printed circuit board or arranged in the non-display area NDA of the display panel DP.

Although not shown in figures, the display apparatus 1000 may further include a flexible printed circuit board connected to the display panel DP. The flexible printed circuit board may apply signals, which are required for an operation of the driving circuit chip DIC, to the driving circuit chip DIC.

Figure 3:
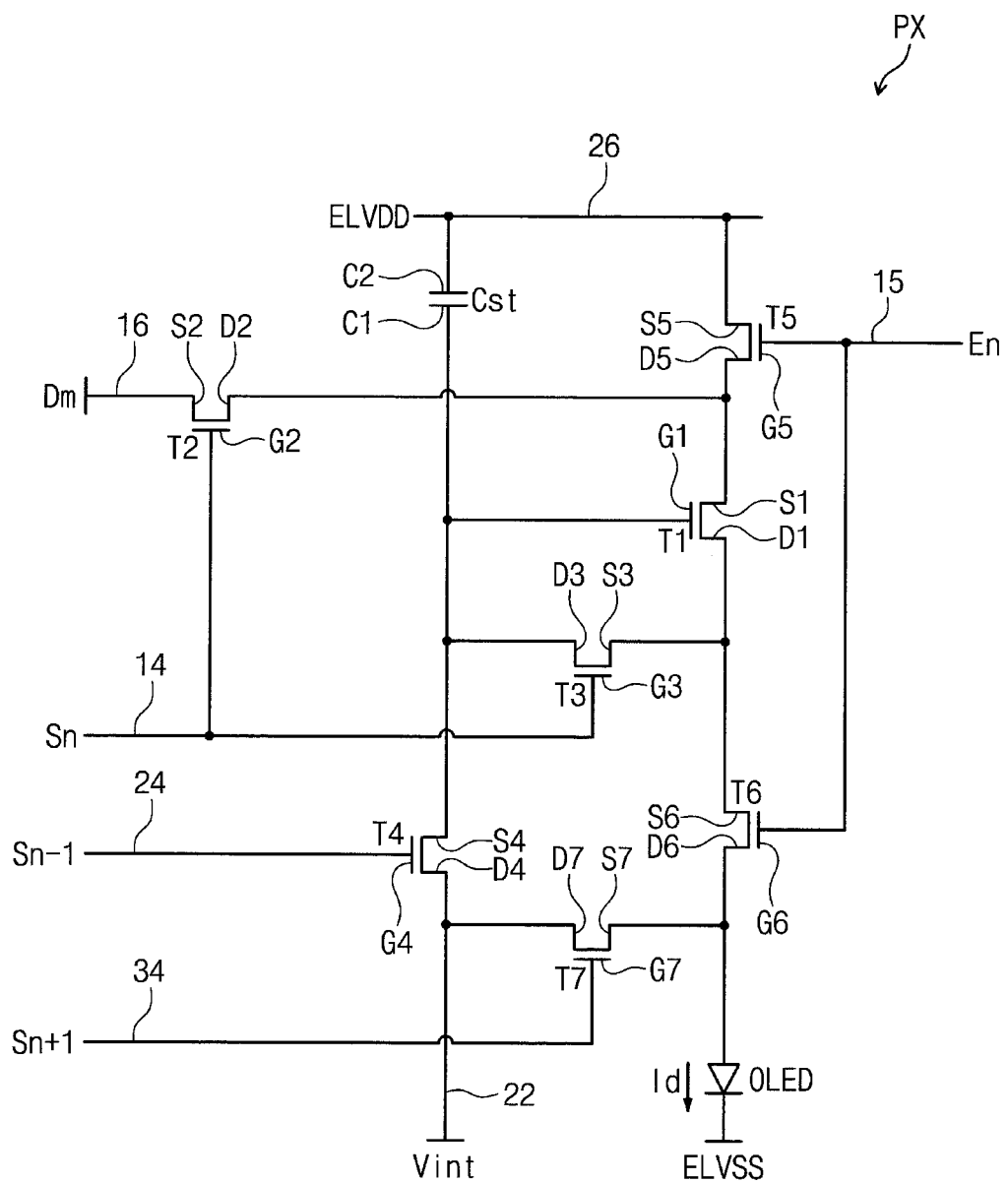
FIG. 3 is an equivalent circuit diagram of one pixel of FIG. 2.

FIG. 3 is an equivalent circuit diagram of one pixel PX of FIG. 2.

The one pixel PX according to some example embodiments of the present invention may include a plurality of transistors T1 to T7, a storage capacitor Cst, and an organic light emitting diode OLED.

The thin film transistors T1 to T7 include a driving transistor T1, a switching transistor T2, a compensating transistor T3, an initializing transistor T4, a first light emitting control transistor T5, a second light emitting control transistor T6, and a bypass transistor T7.

The pixel PX includes a first scan line 14 transmitting an n-th scan signal Sn to the switching transistor T2 and the compensating transistor T3, a second scan line 24 transmitting an (n−1)th scan signal Sn−1 to the initializing transistor T4, a third scan line 34 transmitting an (n+1)th scan signal Sn+1 to the bypass transistor T7, a light emitting line 15 transmitting a light emitting control signal En to the first light emitting control transistor T5 and the second light emitting control transistor T6, a data line 16 transmitting a data signal Dm, a power line 26 transmitting a power voltage ELVDD, and an initializing line 22 transmitting an initializing voltage Vint to initialize the driving transistor T1.

The driving transistor T1 includes a gate electrode G1 connected to a first electrode C1 of the storage capacitor Cst. The driving transistor T1 includes a source electrode S1 connected to the power line 26 via the first light emitting control transistor T5. The driving transistor T1 includes a drain electrode D1 electrically connected to an anode of the organic light emitting diode OLED via the second light emitting control transistor T6. The driving transistor T1 receives the data signal Dm in response to a switching operation of the switching transistor T2 and applies a driving current Id to the organic light emitting diode OLED.

The switching transistor T2 includes a gate electrode G2 connected to the first scan line 14. The switching transistor T2 includes a source electrode S2 connected to the data line 16. The switching transistor T2 includes a drain electrode D2 connected to the source electrode S1 of the driving transistor T1 and connected to the power line 26 via the first light emitting control transistor T5. The switching transistor T2 is turned on in response to the n-th scan signal Sn provided through the first scan line 14 and carries out a switching operation that applies the data signal Dm transmitted through the data line 16 to the source electrode S1 of the driving transistor T1.

The compensating transistor T3 includes a gate electrode G3 connected to the first scan line 14. The compensating transistor T3 includes a source electrode S3 connected to the drain electrode D1 of the driving transistor T1 and connected to the anode of the organic light emitting diode OLED via the second light emitting control transistor T6. The compensating transistor T3 includes a drain electrode D3 connected to the first electrode C1 of the storage capacitor Cst, a source electrode S4 of the initializing transistor T4, and the gate electrode G1 of the driving transistor T1. The compensating transistor T3 is turned on in response to the n-th scan signal Sn provided through the first scan line 14 and connects the gate electrode G1 to the drain electrode D1 of the driving transistor T1 such that the driving transistor T1 is diode-connected.

The initializing transistor T4 includes a gate electrode G4 connected to the second scan line 24. The initializing transistor T4 includes a drain electrode D4 connected to the initializing line 22. The initializing transistor T4 includes the source electrode S4 connected to the first electrode C1 of the storage capacitor Cst, the drain electrode D3 of the compensating transistor T3, and the gate electrode G1 of the driving transistor T1. The initializing transistor T4 is turned on in response to the (n−1)th scan signal Sn−1 provided through the second scan line 24 to apply the initializing voltage Vint to the gate electrode G1 of the driving transistor T1, and thus a voltage of the gate electrode G1 of the driving transistor T1 is initialized.

The first light emitting control transistor T5 includes a gate electrode G5 connected to the light emitting line 15. The first light emitting control transistor T5 is connected between the power line 26 and the driving transistor T1. The first light emitting control transistor T5 includes a source electrode S5 connected to the power line 26. The first light emitting control transistor T5 includes a drain electrode D5 connected to the source electrode S1 of the driving transistor T1 and the drain electrode D2 of the switching transistor T2. When the light emitting control signal En is applied to the gate electrode G5 of the first light emitting control transistor T5, the first light emitting control transistor T5 is turned on, and thus the driving current Id flows through the organic light emitting diode OLED. The first light emitting control transistor T5 may determine a timing at which the driving current Id flows to the organic light emitting diode OLED.

The second light emitting control transistor T6 includes a gate electrode G6 connected to the light emitting line 15. The second light emitting control transistor T6 is connected between the driving transistor T1 and the organic light emitting diode OLED. The second light emitting control transistor T6 includes a source electrode S6 connected to the drain electrode D1 of the driving transistor T1 and the source electrode S3 of the compensating transistor T3.

The second light emitting control transistor T6 includes a drain electrode D6 electrically connected to the anode of the organic light emitting diode OLED. The first light emitting control transistor T5 and the second light emitting control transistor T6 are turned on in response to the light emitting control signal En provided through the light emitting line 15. When the light emitting control signal En is applied to the gate electrode G6 of the second light emitting control transistor T6, the second light emitting control transistor T6 is turned on, and thus the driving current Id flows through the organic light emitting diode OLED. The second light emitting control transistor T6 may determine a timing at which the driving current Id flows to the organic light emitting diode OLED.

The bypass transistor T7 includes a gate electrode G7 connected to the third scan line 34. The bypass transistor T7 includes a source electrode S7 connected to the anode of the organic light emitting diode OLED. The bypass transistor T7 includes a drain electrode D7 connected to the initializing line 22. The bypass transistor T7 is turned on in response to the (n+1)th scan signal Sn+1 provided through the third scan line 34 to initialize the anode of the organic light emitting diode OLED.

The storage capacitor Cst includes a second electrode C2 connected to the power line 26. The first electrode C1 of the storage capacitor Cst is connected to the gate electrode G1 of the driving transistor T1, the drain electrode D3 of the compensating transistor T3, and the source electrode S4 of the initializing transistor T4.

The organic light emitting diode OLED includes a cathode receiving a reference voltage ELVSS. The organic light emitting diode OLED receives the driving current Id from the driving transistor T1 to emit a light.

According to another embodiment of the present disclosure, the number of the transistors T1 to T7 included in the pixel PX and connection relations between the transistors T1 to T7 may be changed variously.

Figure 4:
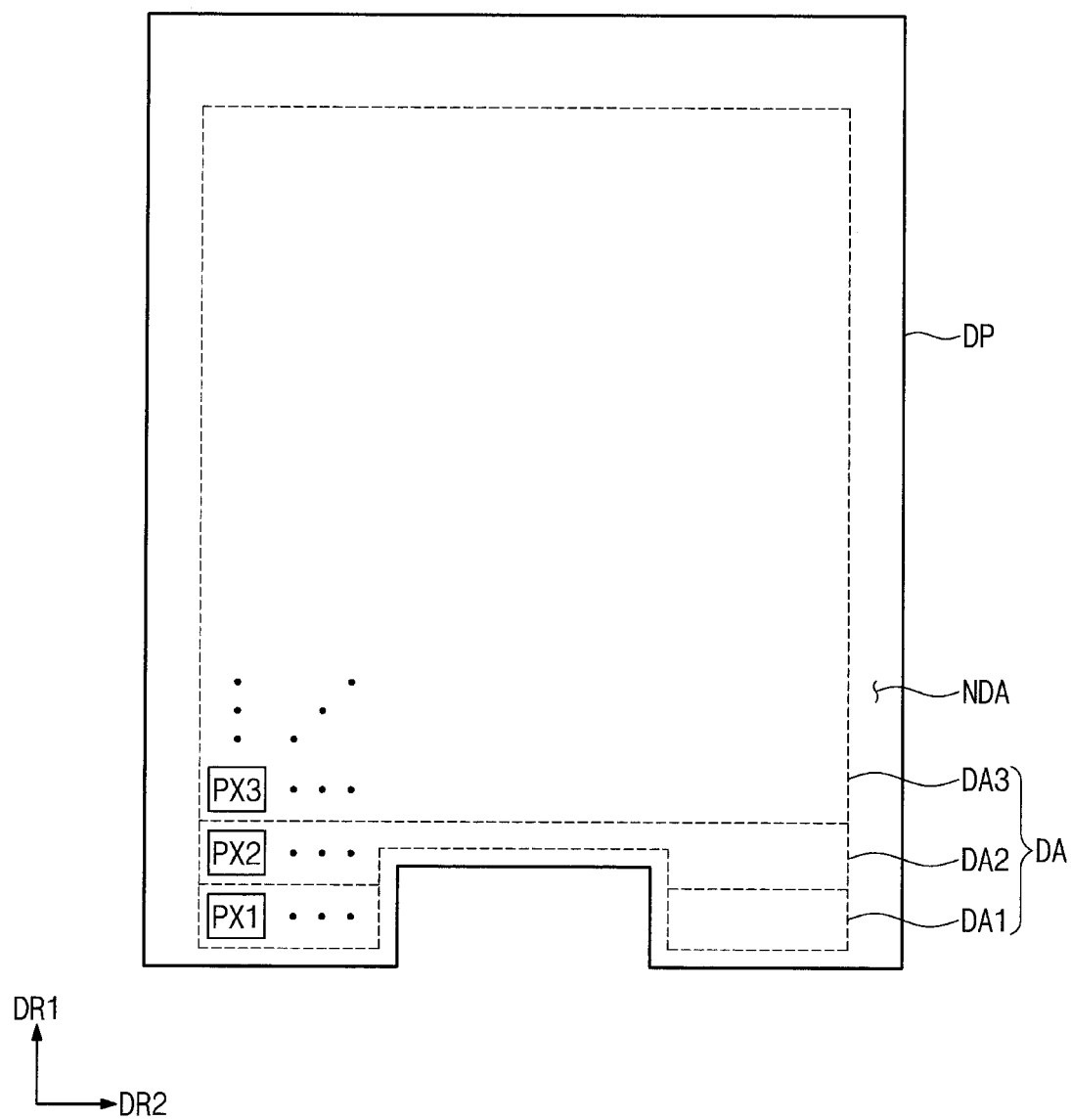
FIG. 4 is a plan view showing a display panel of FIG. 2.

FIG. 4 is a plan view showing the display panel DP of FIG. 2.

Referring to FIGS. 2 and 4, the display area DA of the display panel DP may include first, second, and third display areas DA1, DA2, and DA3.

The first display area DA1 may be defined in the first and second notch parts NTP1 and NTP2 when viewed in a plan view. The second display area DA2 may be defined to overlap with the normal part NP and the first and second notch parts NTP1 and NTP2 when viewed in a plan view. One portion of the second display area DA2 may overlap with the normal part NP, and the other portion of the second display area DA2 may overlap with the first and second notch parts NTP1 and NTP2. The third display area DA3 may be defined in the normal part NP. The first to third display areas DA1 to DA3 may be divided with respect to an imaginary line extending in the second direction DR2. The second display area DA2 may be defined between the first and third display areas DA1 and DA3 in the first direction DR1.

The pixel PX may include a first pixel PX1 arranged in the first display area DA1, a second pixel PX2 arranged in the second display area DA2, and a third pixel PX3 arranged in the third display area DA3. Each of the first to third pixels PX1 to PX3 may be provided in a plural number.

The first scan line SL1 is arranged in the normal part NP and overlaps with the third display area DA3. The second and third scan lines SL2 and SL3 are respectively arranged in the second and third notch parts NTP1 and NTP2 and overlap with the first display area DA1.

Because the length of the first scan line SL1 is longer than the length of the second and third scan lines SL2 and SL3, the first scan line SL1 has a resistance value greater than that of the second and third scan lines SL2 and SL3. Accordingly, a delay value of the scan signal applied to the first scan line SL1 is greater than a delay value of the scan signals applied to the second and third scan lines SL2 and SL3. A pulse-on period of the scan signal applied to the first scan line SL1 is shorter than a pulse-on period of the scan signals applied to the second and third scan lines SL2 and SL3.

In a case that the driving transistor T1 described with reference to FIG. 3 is a PMOS transistor, a gate voltage of the driving transistor T1 is relatively low because the pulse-on period of the scan signal applied to the first scan line SL1 is relatively short, and the organic light emitting diode OLED of the third pixel PX3 connected to the first scan line SL1 emits the light with a relatively high brightness because the current flowing through the organic light emitting diode OLED is relatively high.

That is, the brightness of the first pixel PX1 arranged in the first display area DA1 is different from the brightness of the third pixel PX3 arranged in the third display area DA3, and according to some example embodiments of the present invention, the brightness of the first pixel PX1 arranged in the first display area DA1 may be smaller than the brightness of the third pixel PX3 arranged in the third display area DA3. The brightness of the second pixel PX2 arranged in the second display area DA2 becomes gradually darker from the third display area DA3 to the first display area DA1.

In some example embodiments of the present invention, the data signals applied to the first to third pixels PX1 to PX3 respectively arranged in the first to third display areas DA1 to DA3 are compensated in consideration of brightness difference. Details of the compensation for the data signals will be described later.

Figure 5:
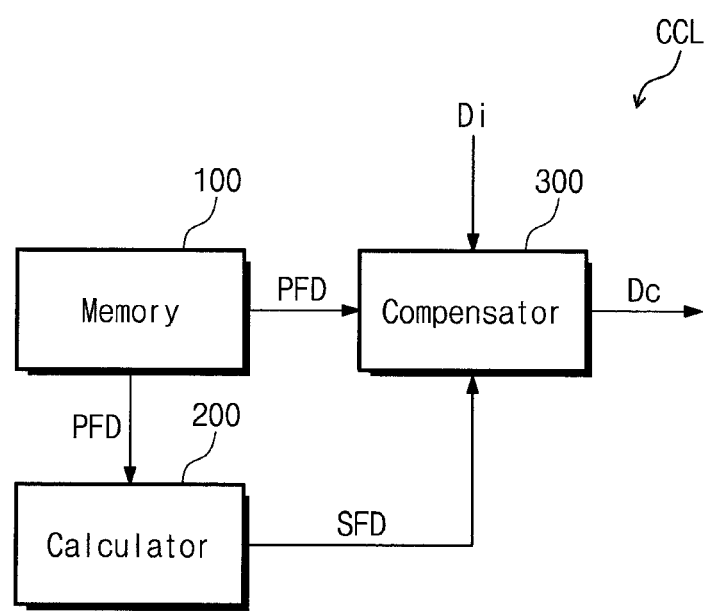
FIG. 5 is a block diagram showing a compensation circuit of FIG. 2 in the display apparatus according to some example embodiments of the present invention.

FIG. 5 is a block diagram showing a compensation circuit of FIG. 2 in the display apparatus according to some example embodiments of the present invention.

Referring to FIGS. 2 and 5, the compensation circuit CCL may include a memory 100, a calculator 200, and a compensator 300.

The memory 100 stores pixel characteristic data PFD. The pixel characteristic data PFD may include brightness information of a pixel group including the pixels PX adjacent to each other of the display panel DP. As an example, the pixel characteristic data PFD may include the brightness information by the pixel group unit including the pixels PX arranged in a matrix configuration of 4 rows by 4 columns. The pixels PX included in one pixel group may have the same brightness information. The number of the pixels PX included in one pixel group may be variously modified. The pixel characteristic data PFD may be data obtained by calculating the brightness information by the pixel group unit after taking a picture of the display panel DP displaying the image having a constant grayscale and measuring the brightness characteristic with respect to every pixel.

The memory 100 may be, but not limited to, a flash memory or a non-sequential access memory (RAM).

The calculator 200 calculates seed data SFD to compensate for the input signal applied to the second pixels PX2 arranged in the second display area DA2. In some example embodiments of the present invention, the calculator 200 reads out the pixel characteristic data PFD from the memory 100 and calculates the seed data SFD based on the brightness information of the first and third pixels PX1 and PX3 of the first and third display areas DA1 and DA3. The calculator 200 interpolates the brightness information of the pixel group of the first display area DA1 and the brightness information of the pixel group of the third display area DA3 along the first direction DR1 to calculate the seed data SFD according to the position of the second pixel PX2 in the first direction DR1. The seed data SFD have the offset compensation value in the pixel group unit including the second pixels PX2, and the number of the second pixels PX2 included in one pixel group unit may be substantially the same as the number of the pixels included in the pixel group of the pixel characteristic data PFD.

The calculator 200 outputs the seed data SFD to the compensator 300.

The compensator 300 receives the input signal Di and compensates for the input signal Di based on the pixel characteristic data PFD and the seed data SFD. The input signal Di may include information about the image regardless of the brightness characteristic of the display panel DP. The compensator 300 outputs compensation data Dc in which the input signal Di is compensated. Then, the compensation data Dc are converted to the data signal, which is a voltage signal, and applied to the data line 16 (refer to FIG. 3).

The compensator 300 may apply different compensation methods to the first to third display areas DA1 to DA3 when compensating for the input signal Di.

The compensator 300 compensates for grayscale values of the input signals Di corresponding to the first and third pixels PX1 and PX3 respectively arranged in the first and third display areas DA1 and DA3 based on the pixel characteristic data PFD and compensates for a grayscale value of the input signal Di corresponding to the second pixels PX2 arranged in the second display area DA2 based on the seed data SFD. Hereinafter, the input signals Di respectively corresponding to the first to third pixels PX1 to PX3 arranged in the first to third display areas DA1 to DA3 are referred to as first to third input signals, respectively.

In detail, the compensator 300 compensates the first input signal of the first pixel PX1 for the offset compensation value corresponding to the brightness information of the pixel group including the first pixel PX1 of the first display area DA1, which is to be compensated, among the pixel characteristic data FPD.

In addition, the compensator 300 compensates the third input signal of the third pixel PX3 for the offset compensation value corresponding to the brightness information of the pixel group including the third pixel PX3 of the third display area DA3, which is to be compensated, among the pixel characteristic data FPD.

The compensator 300 compensates the second input signal of the second pixel for the offset compensation value corresponding to the brightness information of the second pixel PX2 of the second display area DA2, which is to be compensated, among the seed data SFD. That is, the compensator 300 compensates the second input signal for the value different from the offset compensation value of the pixel characteristic data PFD.

Figure 6:
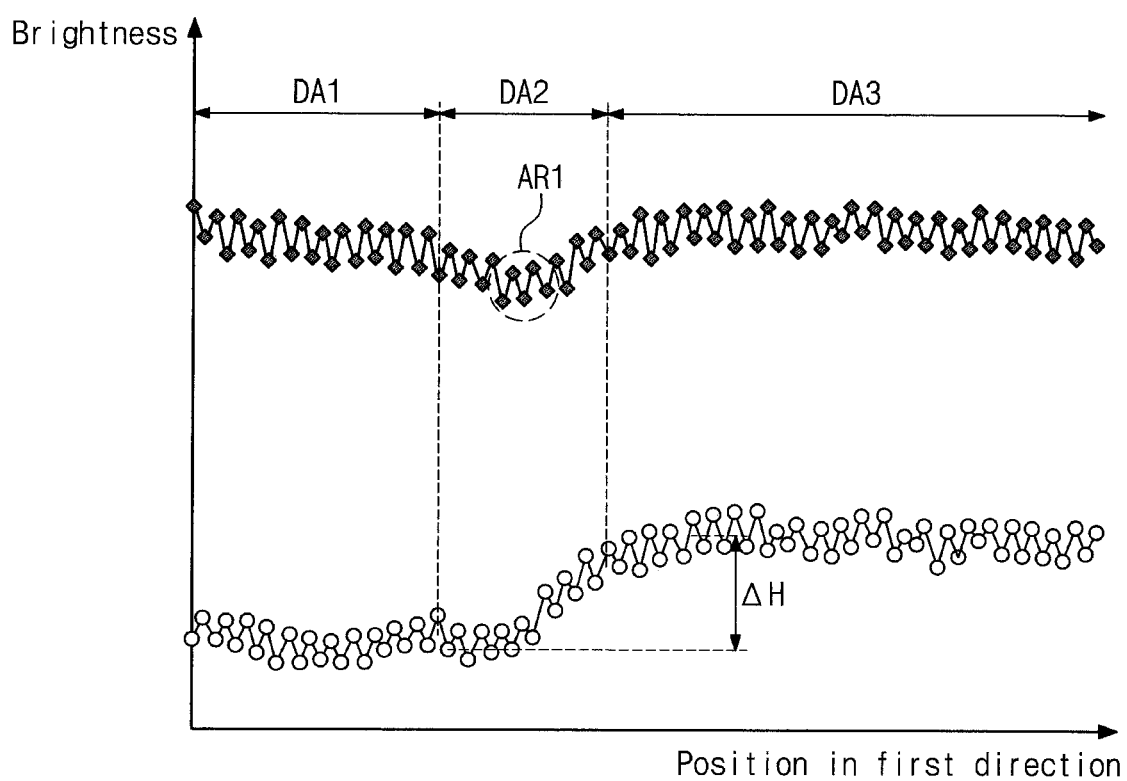
FIG. 6 is a view showing a brightness of a display apparatus when input signals corresponding to pixels in first to third display areas are compensated based on pixel characteristic data and a brightness of the display apparatus when the input signals are not compensated in the display apparatus according to some example embodiments of the present invention.

FIG. 6 is a view showing a brightness of a display apparatus when input signals corresponding to pixels in first to third display areas are compensated based on pixel characteristic data and a brightness of the display apparatus when the input signals are not compensated in the display apparatus according to some example embodiments of the present invention.

In FIG. 6, a line connecting circles shows the brightness of the display apparatus when the input signal is not compensated, and a line connecting rhombuses shows the brightness of the display apparatus when the input signal is compensated on the basis of the pixel characteristic data. In FIG. 6, the brightnesses of the pixels are shown in the circles or the rhombuses, and the brightnesses of the pixels adjacent to each other, which are measured before and after the data compensation, are connected to each other.

In FIG. 6, a horizontal axis indicates the position in the first direction. DR1 of the display panel shown in FIG. 4, and a vertical axis indicates the brightness.

Referring to FIGS. 5 and 6, in the case that the input signal is not compensated, a brightness difference ΔH occurs between the first display area DA1 and the third display area DA3. However, in the case that the input signal is compensated on the basis of the pixel characteristic data PFD, brightness difference substantially does not occur between the first and third display areas DA1 and DA3, and an area in which the brightness is rapidly varied is not observed in each of the first display area DA1 and the third display area DA3.

In the case of the second display area DA2, the brightness may be rapidly lowered in a boundary area AR1 between the normal part NP and the notch parts NTP1 and NTP2 described with reference to FIG. 2 when the data are compensated on the basis of the pixel characteristic data PFD, and the line extending in the second direction DR2 may be perceived.

Accordingly, in some example embodiments of the present invention, the input signal Di corresponding to the second pixels PX2 arranged in the second display area DA2 are compensated based on the seed data SFD calculated on the basis of the brightness information of the first and third display areas DA1 and DA3 without being compensated on the basis of the pixel characteristic data PFD.

According to the display apparatus 1000 (refer to FIG. 2) of the present disclosure, the brightness of the image displayed through the first to third display areas DA1 to DA3 may be uniformly controlled.

Figure 7:
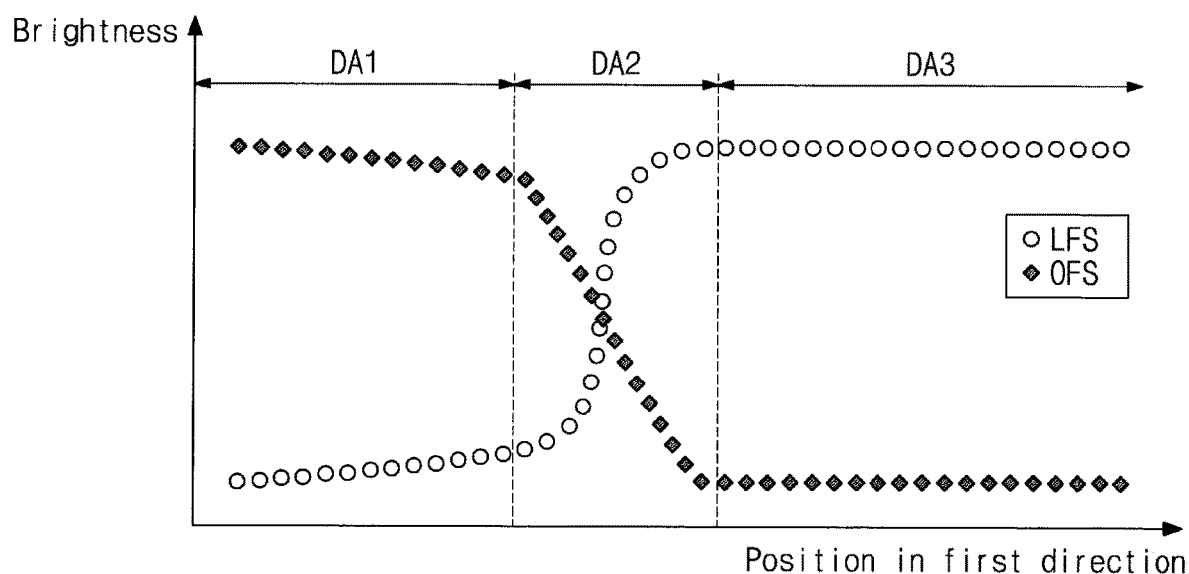
FIG. 7 is a view showing a brightness according to a position in a first direction and offset compensation values corresponding to pixel characteristic data and seed data in a display apparatus according to some example embodiments of the present invention.

FIG. 7 is a view showing a brightness LFS according to a position in a first direction and offset compensation values OFS corresponding to pixel characteristic data and seed data according to the position in the first direction in a display apparatus according to some example embodiments of the present invention. In FIG. 7, one circle or one rhombus may be the brightness information of the one pixel group described with reference to FIG. 4 or the offset compensation value of the input signal applied to the one pixel group.

Referring to FIGS. 4, 5, and 7, because the offset compensation values OFS corresponding to the pixel characteristic data PFD and the seed data SFD are used to compensate for the brightness of the display apparatus 1000, the offset compensation values OFS may be inversely proportional to the brightness LFS of the display apparatus 1000.

The pixel characteristic data PFD corresponding to the first and third display areas DA1 and DA3 are values stored in the memory 100. The seed data SFD corresponding to the second display area DA2 are values calculated by interpolating the pixel characteristic data PFD.

In some example embodiments of the present invention, the seed data SFD may have the offset compensation value that linearly varies depending on the change of the position of the second pixel PX2, which is to be compensated, in the first direction DR1 between the first and third display areas DA1 and DA3. The seed data SFD are determined by the pixel characteristic data PFD corresponding to the first and third display areas DA1 and DA3 regardless of the brightness of the second display area DA2.

According to the display apparatus 1000 of the present disclosure, although the second area DA2 is compensated in the pixel group unit including the second pixels PX2, the brightness may be uniformly controlled regardless of the position in the first direction DR1 in the second display area DA2. In addition, the line extending in the second direction DR2 in the boundary area AR1 between the normal part NP and the notch parts NTP1 and NTP2 may be prevented (or reduced) from being perceived.

Figure 8:
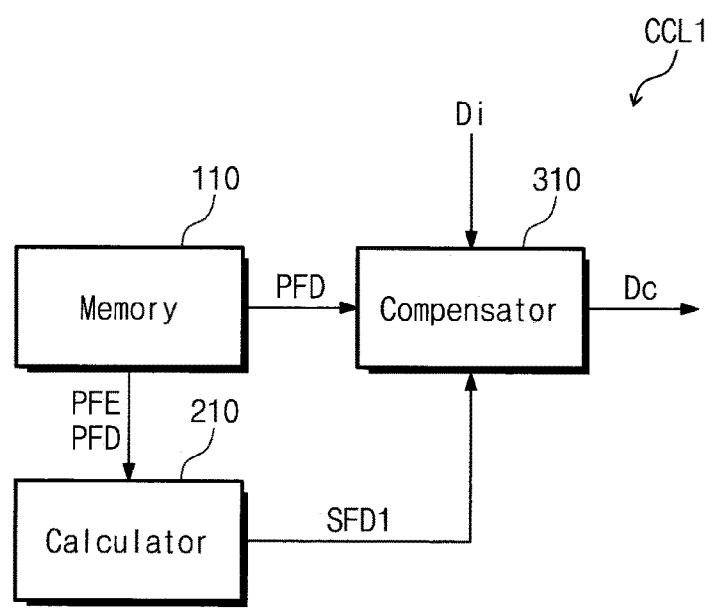
FIG. 8 is a block diagram showing a driving circuit chip of a display apparatus according to some example embodiments of the present invention.

FIG. 8 is a block diagram showing a driving circuit chip of a display apparatus according to some example embodiments of the present invention.

Referring to FIGS. 4 and 8, a compensation circuit CCL1 may include a memory 110, a calculator 210, and a compensator 310.

The compensation circuit CCL1, according to some example embodiments of the present invention, has substantially the same configuration as that of the compensation circuit CCL described with reference to FIG. 5, and thus different features between the compensation circuit CCL and the compensation circuit CCL1 will be mainly described hereinafter.

The memory 110 stores pixel characteristic data PFD and area characteristic data PFE. The area characteristic data PFE may include brightness information of each of the second pixels PX2 in the second area DA2. The area characteristic data PFE may be data obtained by calculating the brightness information of the pixel arranged in the second display area DA2 after taking a picture of the display panel DP displaying the image having a constant grayscale.

The calculator 210 calculates seed data SFD1. In some example embodiments of the present invention, the calculator 210 reads out the pixel characteristic data PFD and the area characteristic data PFE from the memory 110 and calculates the seed data SFD1 based on the pixel characteristic data PFD and the area characteristic data PFE. The calculator 210 determines a range of the offset compensation value using the brightness information of the pixel group in the first display area DA1 and the brightness information of the pixel group in the third display area DA3 and calculates a curved shape of the offset compensation value depending on the position of the second pixels PX2 of the second display area DA2 in the first direction DR1 based on the area characteristic data PFE.

The compensator 310 compensates for the input signal Di corresponding to the first and third pixels PX1 and PX3 respectively arranged in the first and third display areas DA1 and DA3 based on the pixel characteristic data PFD and compensates for the input signal Di corresponding to the second pixels PX2 arranged in the second display area DA2 based on the seed data SFD1.

Figure 9:
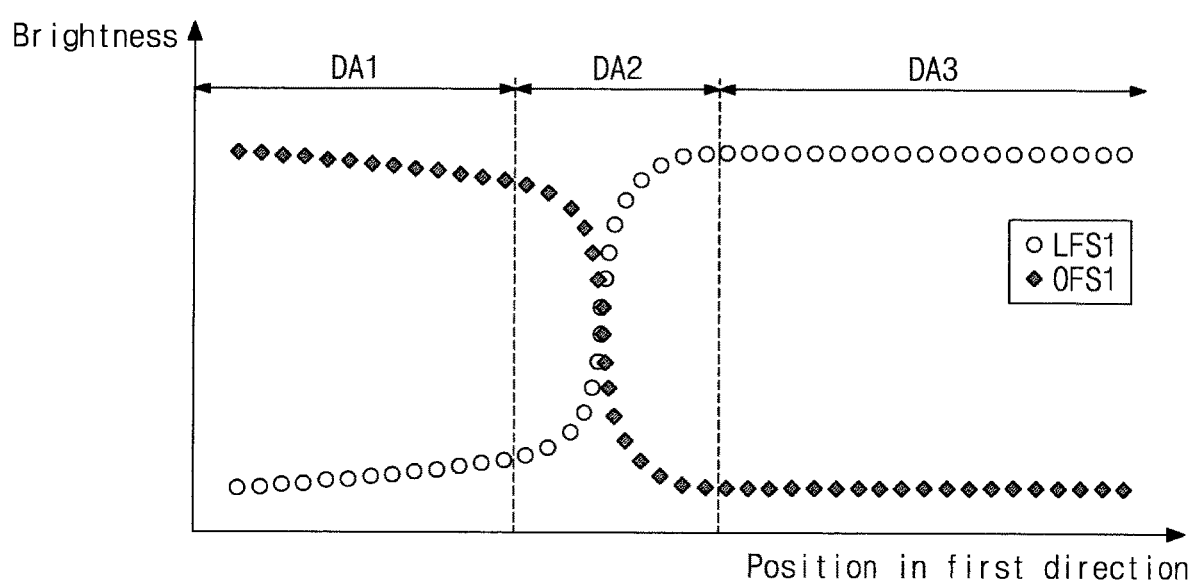
FIG. 9 is a view showing a brightness according to a position in a first direction and offset compensation values corresponding to pixel characteristic data and seed data in a display apparatus having the driving circuit chip of FIG. 8 according to some example embodiments of the present invention.

FIG. 9 is a view showing a brightness according to a position in a first direction and offset compensation values corresponding to pixel characteristic data and seed data according to the position in the first direction in a display apparatus having the driving circuit chip of FIG. 8 according to some example embodiments of the present invention. In FIG. 9, one circle or one rhombus may be the brightness information of the one pixel group described with reference to FIG. 4 or the offset compensation value of the input signal applied to the one pixel group.

Referring to FIGS. 8 and 9, because offset compensation values OFS1 corresponding to the pixel characteristic data PFD and the seed data SFD1 are used to compensate for the brightness of the display apparatus 1000, the offset compensation values OFS1 may be inversely proportional to the brightness LFS1 of the display apparatus 1000.

The pixel characteristic data PFD corresponding to the first and third display areas DA1 and DA3 are values stored in the memory 110. The seed data SFD1 corresponding to the second display area DA2 are values calculated based on the pixel characteristic data PFD and the area characteristic data PFE. Because the area characteristic data PFE include the brightness information of each second pixel PX2 of the second display area DA2, the area characteristic data PFE have relatively accurate brightness information of the second display area DA2 in the first direction DR1. In some example embodiments of the present invention, the seed data SFD1 may have the offset compensation value in a curved line shape.

According to the display apparatus including the compensation circuit CCL1 shown in FIG. 8, the brightness may be uniformly controlled in the second display area DA by taking into account the brightness characteristic of the second display area DA2 regardless of the position in the first direction DR1 in the second display area DA2.

Figure 10:
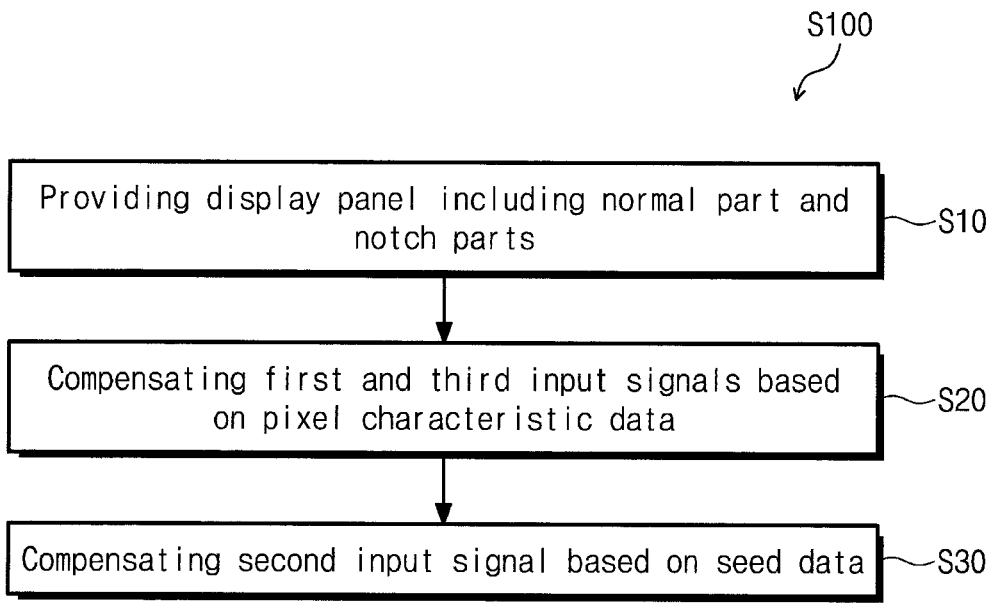
FIGS. 10 to 12 are flowcharts showing a method of compensating for data of a display apparatus according to some example embodiments of the present invention.

FIG. 10 is a flowchart showing a method of compensating for data of a display apparatus S100 according to some example embodiments of the present invention.

Referring to FIG. 10, the method of compensating for the data of the display apparatus S100 includes providing the display panel including the normal part and the notch parts S10, compensating the first and third input signals based on the pixel characteristic data S20, and compensating the second input signal based on the seed data S30.

The display panel DP has been described with reference to FIGS. 2 and 4, and thus details thereof will be omitted.

Operations S20 and S30 may be carried out by the compensation circuit CCL and CCL1 described with reference to FIGS. 5 and 8.

Figure 11:
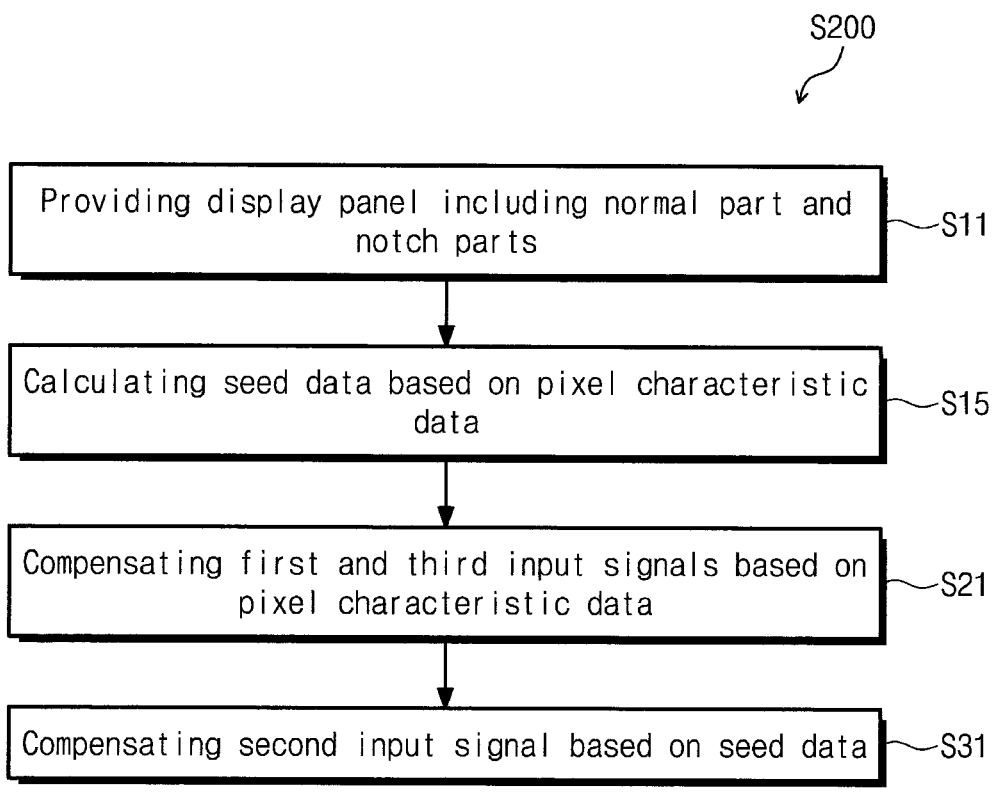

FIG. 11 is a flowchart showing a method of compensating for data of a display apparatus S200 according to some example embodiments of the present invention.

Referring to FIG. 11, the method of compensating for the data of the display apparatus S200 includes providing the display panel including the normal part and the notch parts S11, calculating the seed data based on the pixel characteristic data S15, compensating for the first and third input signals based on the pixel characteristic data S21, and compensating for the second input signal based on the seed data S31.

The method of compensating for the data of the display apparatus S200 shown in FIG. 11 may be carried out by the compensation circuit CCL described with reference to FIG. 5. Because the data compensation method of the compensation circuit CCL has been described with reference to FIGS. 5 and 7, repetitive details thereof will be omitted.

Figure 12:
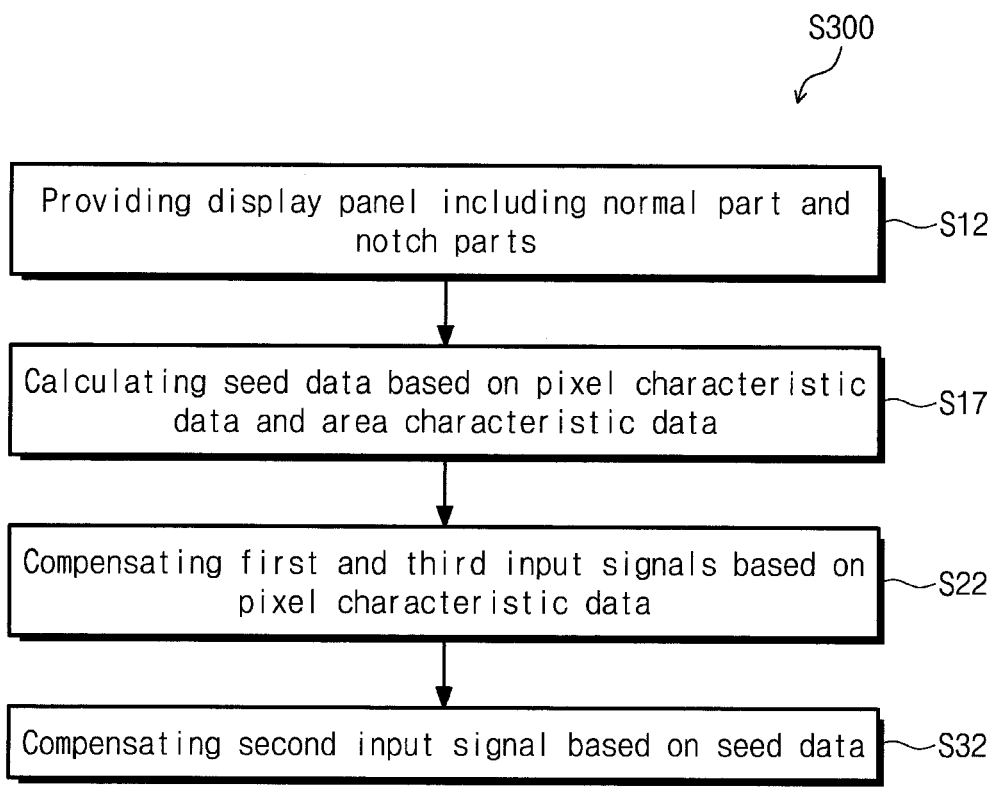

FIG. 12 is a flowchart showing a method of compensating for data of a display apparatus S300 according to some example embodiments of the present invention.

Referring to FIG. 12, the method of compensating for the data of the display apparatus S300 includes providing the display panel including the normal part and the notch parts S12, calculating the seed data based on the pixel characteristic data and the area characteristic data S17, compensating for the first and third input signals based on the pixel characteristic data S22, and compensating for the second input signal based on the seed data S32.

The method of compensating for the data of the display apparatus S300 shown in FIG. 12 may be carried out by the compensation circuit CCL1 described with reference to FIG. 8. Because the data compensation method of the compensation circuit CCL1 has been described with reference to FIGS. 8 and 9, details thereof will be omitted.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present invention.

Although some example embodiments of the present invention have been described, it is understood that the present invention should not be limited to these example embodiments but various changes and modifications can be made by one ordinary skilled in the art within the spirit and scope of the present invention as hereinafter claimed.

Therefore, the disclosed subject matter should not be limited to any single embodiment described herein, and the scope of the present inventive concept shall be determined according to the following claims and their equivalents.

What is claimed is:
1. A display apparatus comprising:
 a display panel comprising:
  a normal part and a notch part protruding from the normal part;
  a display area at the normal part and the notch part, the display area comprising a first display area within the normal part, a second display area overlapping the normal part and the notch part, and a third display area within the notch part, each of the normal part and the notch part comprising a plurality of pixels; and
  a non-display area adjacent to the display area; and
 a compensation circuit configured to:
  receive first, second, and third input signals having image information respectively displayed through the first, second, and third display areas; and
  compensate for a grayscale value of the first, second, and third input signals, wherein the compensation circuit is configured to compensate for the first and third input signals based on pixel characteristic data and to compensate for the second input signal based on seed data different from the pixel characteristic data, wherein the seed data is calculated based on brightness information of the first display area and the third display area.

2. The display apparatus of claim 1, wherein the normal part has a quadrangular shape, and the notch part comprises a first notch part protruding from a first corner of one side portion of the normal part and a second notch part protruding from a second corner of the one side portion of the normal part and spaced apart from the first notch part.

3. The display apparatus of claim 2, wherein the first, second, and third display areas are adjacent to each other in a first direction and distinguished from each other with respect to an imaginary line extending in a second direction parallel to the one side portion of the normal part.

4. The display apparatus of claim 2, wherein the display panel comprises first, second, and third scan lines connected to corresponding pixels among the pixels and first and second scan driving circuits in the non-display area and spaced apart from each other, wherein the first scan line is in the normal part, the second scan line is in the first notch part, and the third scan line is in the second notch part.

5. The display apparatus of claim 4, wherein a first end of the first scan line is connected to the first scan driving circuit, a second end of the first scan line is connected to the second scan driving circuit, the second scan line is connected to the first scan driving circuit, and the third scan line is connected to the second scan driving circuit.

6. The display apparatus of claim 1, wherein the compensation circuit comprises:
a memory configured to store the pixel characteristic data having brightness information of the first, second, and third display areas in a pixel group comprising some pixels of the pixels;
a calculator configured to calculate the seed data having the brightness information of the second display area in the pixel group based on the pixel characteristic data; and
a compensator configured to compensate for the first and third input signals based on the pixel characteristic data and to compensate for the second input signal based on the seed data.

7. The display apparatus of claim 6, wherein the calculator is configured to interpolate the brightness information of the pixel group of the first display area and the brightness information of the pixel group of the third display area to calculate the seed data.

8. The display apparatus of claim 7, wherein the first, second, and third display areas are adjacent to each other in a first direction and distinguished from each other with respect to an imaginary line extending in a second direction crossing the first direction, and the seed data have an offset compensation value that linearly varies depending on a position of the second display area in the first direction.

9. The display apparatus of claim 1, wherein the compensation circuit comprises:
a memory configured to store the pixel characteristic data having brightness information of the first, second, and third display areas in a pixel group comprising some pixels of the pixels and area characteristic data having the brightness information of each of the pixels overlapped with the second display area;
a calculator configured to calculate the seed data having the brightness information of the second display area in the pixel group based on the pixel characteristic data and the area characteristic data; and
a compensator configured to compensate for the first and third input signals based on the pixel characteristic data and to compensate for the second input signal based on the seed data.

10. The display apparatus of claim 9, wherein the first, second, and third display areas are adjacent to each other in a first direction and distinguished from each other with respect to an imaginary line extending in a second direction crossing the first direction, and the seed data have an offset compensation value having a curved shape depending on a position of the second display area in the first direction.

11. The display apparatus of claim 10, wherein the calculator is configured to calculate the curved shape of the offset compensation value depending on the position of the second display area in the first direction based on the area characteristic data, and the calculator is configured to determine a range of the offset compensation value of the seed data using the brightness information of the pixel group in the first display area and the brightness information of the pixel group in the third display area.

12. A display apparatus comprising:
a display panel comprising:
a normal part and a notch part protruded from the normal part;
a display area at the normal part and the notch part, the display area comprising a first display area within the normal part, a second display area overlapping the normal part and the notch part, and a third display area within the notch part, each of the normal part and the notch part comprising a plurality of pixels; and
a non-display area adjacent to the display area; and
a compensation circuit configured to:
receive first, second, and third input signals having image information respectively displayed through the first, second, and third display areas; and
compensate for a grayscale value of the first, second, and third input signals, the compensation circuit comprising a memory configured to store pixel characteristic data, wherein the compensation circuit is configured to compensate the first and third input signals for an offset compensation value of the pixel characteristic data and to compensate the second input signal for a value different from the offset compensation value of the pixel characteristic data including brightness information of the first display area and the third display area.

13. The display apparatus of claim 12, wherein the normal part has a quadrangular shape, and the notch part comprises a first notch part protruding from a first corner of one side portion of the normal part and a second notch part protruding from a second corner of the one side portion of the normal part and spaced apart from the first notch part.

14. The display apparatus of claim 13, wherein the first, second, and third display areas are adjacent to each other in a first direction and distinguished from each other with respect to an imaginary line extending in a second direction parallel to the one side portion of the normal part.

15. The display apparatus of claim 12, wherein
the memory is configured to store the pixel characteristic data having brightness information of the first, second, and third display areas in a pixel group unit comprising some pixels of the pixels;
wherein the compensation circuit further comprises:
a calculator configured to calculate seed data having the brightness information of the second display area in the pixel group unit based on the pixel characteristic data; and a compensator configured to compensate for the first and third input signals based on the pixel characteristic data and to compensate for the second input signal based on the seed data.

16. A method of compensating for data of a display apparatus, the display apparatus comprising:
a display panel comprising:
   a normal part and a notch part protruding from the normal part;
   a display area at the normal part and the notch part, the display area comprising a first display area in the normal part, a second display area overlapping the normal part and the notch part, and a third display area in the notch part, each of the normal part and the notch part comprising a plurality of pixels; and
   a non-display area adjacent to the display area, the method comprising:
   compensating for first and third input signals having image information respectively displayed through the first and third display areas based on pixel characteristic data; and
   compensating for a second input signal having the image information displayed through the second display area based on seed data different from the pixel characteristic data, wherein the seed data is calculated based on brightness information of the first display area and the third display area.

17. The method of claim 16, further comprising calculating the seed data based on the pixel characteristic data stored in a memory.

18. The method of claim 17, wherein the calculating of the seed data comprises interpolating brightness information of a pixel group comprising some pixels of the pixels of the first display area and brightness information of a pixel group of the third display area to calculate the seed data.

19. The method of claim 16, further comprising calculating the seed data based on the pixel characteristic data and area characteristic data which are stored in a memory.

20. The method of claim 19, wherein the calculating of the seed data comprises calculating a curved shape of an offset compensation value depending on a position of the second display area based on the area characteristic data.

* * * * *